United States Patent
Amano et al.

(10) Patent No.: US 6,829,273 B2
(45) Date of Patent: Dec. 7, 2004

(54) NITRIDE SEMICONDUCTOR LAYER STRUCTURE AND A NITRIDE SEMICONDUCTOR LASER INCORPORATING A PORTION OF SAME

(75) Inventors: Hiroshi Amano, Aichi (JP); Isamu Akasaki, Aichi (JP); Yawara Kaneko, Chigasaki (JP); Norihide Yamada, Tokyo (JP); Tetsuya Takeuchi, Mountain View, CA (US); Satoshi Watanabe, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 316 days.

(21) Appl. No.: 10/040,328

(22) Filed: Dec. 19, 2001

(65) Prior Publication Data

US 2002/0094002 A1 Jul. 18, 2002
US 2004/0213309 A9 Jul. 18, 2002

Related U.S. Application Data

(63) Continuation of application No. PCT/US00/19387, filed on Jul. 14, 2000.

(30) Foreign Application Priority Data

Jul. 16, 1999 (JP) ............................................ 11-203930

(51) Int. Cl.$^7$ ................................................. H01S 5/00
(52) U.S. Cl. .............................. 372/45; 372/43; 372/44; 372/42; 372/46
(58) Field of Search ............................. 372/45, 44, 46, 372/42, 96

(56) References Cited

U.S. PATENT DOCUMENTS

| | | | |
|---|---|---|---|
| 5,146,465 A | * | 9/1992 | Khan et al. ................... 372/45 |
| 5,530,715 A | * | 6/1996 | Shieh et al. .................. 372/96 |
| 5,592,501 A | | 1/1997 | Edmond et al. ............... 372/45 |
| 5,670,798 A | | 9/1997 | Schetzina ..................... 257/96 |
| 5,798,537 A | | 8/1998 | Nitta .......................... 257/103 |
| 6,324,200 B1 | * | 11/2001 | Kamiyama et al. ........... 372/45 |
| 2001/0038656 A1 | * | 11/2001 | Takeuchi et al. .............. 372/45 |
| 2002/0137249 A1 | * | 9/2002 | Ishida et al. .................. 438/47 |

FOREIGN PATENT DOCUMENTS

| | | |
|---|---|---|
| EP | 0678945 A | 10/1995 |
| EP | 0723303 A | 7/1996 |
| EP | 0772249 A | 5/1997 |
| JP | 09-199759 | 7/1997 |
| WO | WO 99/25030 | 5/1999 |

OTHER PUBLICATIONS

Amano, H. et al. "Improvement of Crystalline Quality of Group III Mitrides on Sapphire Using Low Temperature Interlayers", MRS Internet J. Nitride Semiconductors Res. 4A1, G10.1, 1999.

(List continued on next page.)

*Primary Examiner*—Minsun Oh Harvey
*Assistant Examiner*—Dung Nguyen
(74) *Attorney, Agent, or Firm*—Ian Hardcastle

(57) ABSTRACT

The nitride semiconductor layer structure comprises a buffer layer and a composite layer on the buffer layer. The buffer layer is a layer of a low-temperature-deposited nitride semiconductor material that includes AlN. The composite layer is a layer of a single-crystal nitride semiconductor material that includes AlN. The composite layer includes a first sub-layer adjacent the buffer layer and a second sub-layer over the first sub-layer. The single-crystal nitride semiconductor material of the composite layer has a first AlN molar fraction in the first sub-layer and has a second AlN molar fraction in the second sub-layer. The second AlN molar fraction is greater than the first AlN molar fraction. The nitride semiconductor laser comprises a portion of the above-described nitride semiconductor layer structure, and additionally comprises an optical waveguide layer over the composite layer and an active layer over the optical waveguide layer.

19 Claims, 5 Drawing Sheets

OTHER PUBLICATIONS

Nakamura, S. et al., "Continuous–Wave Operation of InGaN/GaN/AlGaN–based Laser Diodes grown on GaN Substrates", Applied Physics Letters, vol. 72, No. 16, Apr. 20, 1998, pp. 2014–2016.

Ohba, Y., "Fabrication and Characterization of AlGaN/GaN Double–Heterolaser Structures on Sapphire Substrates Using Single Crystalline AlN Buffer Layers", Japan J. Physics, vol. 37, 1998, pp.905–906.

Hofstetter, Daniel et al., "Excitation of a Higher Order Transverse Mode in an Optically Pumped $In_{0.15}Ga_{0.85}N/In_{0.05}Ga_{0.95}N$ Multiquantum Well Laser Structure", Applied Physics Letters, vol. 70, No. 13, Mar. 31, 1997, pp. 1650–1652.

Nakamura, S. et al., "InGaN/GaN/AlGaN–based Laser Diodes with Modulation–Doped Strain–Layer Supelattices Grown on an Epitaxially Laterally Overgrown GaN Substrate", Applied Physics Letters, vol. 72, No. 2, Jan. 12, 1998, pp. 211–213.

Ito, K., et al., "Preparation of $Al_xGa_{1-x}N/GaN$ Heterostructure by MOVPE", Journal of Crystal Growth, vol. 104, 1990, pp. 533–538.

Usui, Akira et al., "Thick GaN Epitaxial Growth with Low Dislocation Density by Hydride Vapor Phase Epitaxy", Japan Journal of Applied Physics, vol. 36, 1997, pp. L899–902.

Takahashi, Naoyuki, "Growth of GaN on GaAs (111)B by Mitalorganic Hydrogen Chloride VPE Using Double Buffer Layer", Japan Journal of Applied Physics, vol. 36, 1997, pp. L1133–1135.

Grandjean, N t al., "Si and Mg Doped GaN Layers Grown by Gas Source Molecular Beam Epitaxy Using Ammonia", Mat. Res. Soc. Symposium, Vol 482, 1998, pp. 211–216.

* cited by examiner-

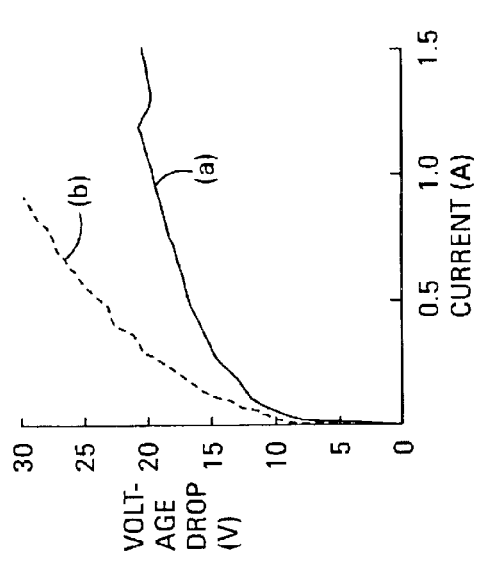
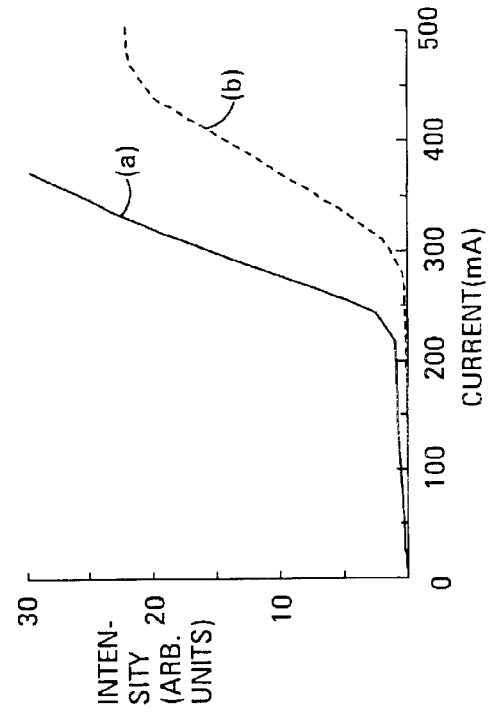
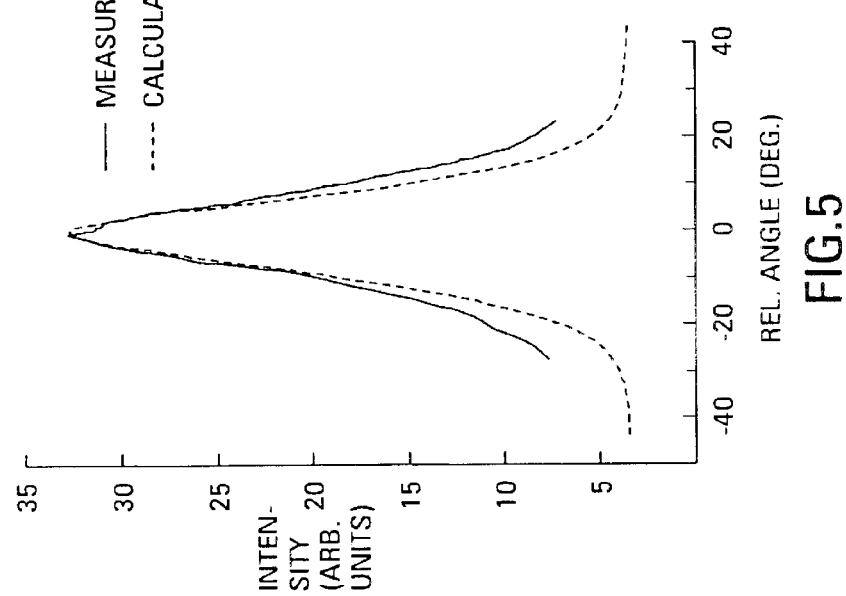
FIG.6
FIG.7
FIG.5

NITRIDE SEMICONDUCTOR LAYER STRUCTURE AND A NITRIDE SEMICONDUCTOR LASER INCORPORATING A PORTION OF SAME

This application is a continuation of pending International Application under the Patent Cooperation Treaty International Application No. PCT/US00/193871, International Filing Date 14 Jul. 2000, publication no. WO0106608, publication date 25 Jan. 2001.

BACKGROUND OF THE INVENTION

Nitride semiconductor devices made from Group III-nitride semiconductor materials have substantial promise as electro-optical devices such as lasers and light-emitting diodes. The general formula of these materials is $Al_xGa_{1-x-y}In_yN$, where Al is aluminum, Ga is gallium, In is indium, N is nitrogen, and x and y are compositional ratios. For instance, these materials have been reported as being used to fabricate lasers that generate light in the blue through ultra-violet part of the spectrum. However, a major practical problem with conventionally-structured lasers fabricated using nitride semiconductor materials is that the far-field pattern of the light generated by such lasers exhibits more than one peak. The far-field pattern is the Fourier transform of the near-field pattern of the light. See, for example, D. Hofstetter et al., *Excitation of a Higher Order Transverse Mode in an Optically-Pumped $In_{0.15}Ga_{0.85}N/In_{0.05}Ga_{0.95}N$ Multi Quantum Well Laser Structure*, 70 APPL. PHYS. LETT., 1650 (1997). A laser that generates light having a far-field pattern that exhibits multiple peaks has substantially fewer practical applications than a laser that generates light having a far-field pattern that exhibits a single peak.

The far-field pattern of the light generated by such a conventional laser exhibits multiple peaks, rather than the desired single peak, because the optical confinement structure formed by an optical waveguide layer and an underlying cladding layer in the laser provides insufficient optical confinement. The optical confinement structure allows light to leak from the optical waveguide layer into the contact layer underlying the cladding layer. The contact layer then acts as a parasitic optical waveguide that causes spurious laser oscillation in a high-order mode. The contact layer is used to inject current into the active layer of the laser.

Attempts to achieve sufficient optical confinement have included using a cladding layer having an increased thickness, and increasing the refractive index difference between the semiconductor materials of the optical waveguide layer and the cladding layer. However, when implemented conventionally, these measures increase the incidence of cracks in the laser structure. This significantly reduces the production yield.

FIG. 1 is a schematic side view of the structure of the conventional nitride semiconductor layer structure 10 from which conventional nitride semiconductor lasers can be made. In all of the Figures in this disclosure that depict semiconductor layer structures and semiconductor lasers, the thicknesses of the layers are greatly exaggerated relative to their widths, and the thicknesses of the thinner layers are exaggerated more than those of the thicker layers, to enable the layers to be shown clearly.

The nitride semiconductor layer structure 10 is composed of the buffer layer 12 of low-temperature-deposited GaN, the n-contact layer 13 of n-type GaN, the cladding layer 14 of n-type AlGaN, the optical waveguide layer 15 of n-type GaN, the active layer 16 of GaInN, the electron blocking layer 17 of p-type AlGaN, the optical waveguide layer 18 of p-type GaN, the cladding layer 19 of p-type AlGaN and the p-contact layer 20 of p-type GaN. The layers 12 through 20 are successively formed on the substrate 11. The material of the substrate is sapphire, SiC, spinel, MgO, GaAs, silicon, or some other suitable material.

The buffer layer 12 is a 35 nm-thick layer of GaN deposited at a temperature of 550° C., i.e., at a temperature below that at which single-crystal growth occurs. The n-contact layer 13 is a 4 μm-thick layer of GaN doped n-type with about $1\times10^{18}$ cm$^{-3}$ of Si. The cladding layer 14 is a 600 nm-thick layer of AlGaN having an AlN molar fraction of 0.06 and doped n-type with about $1\times10^{18}$ cm$^{-3}$ of Si. The optical waveguide layer 15 is a 100 nm-thick layer of GaN doped n-type with about $1\times10^{18}$ cm$^{-3}$ of Si. The active layer 16 is composed of five pairs of sub-layers. Each pair of sub-layers is composed of a 3 nm-thick sub-layer of GaInN having an InN molar fraction of 0.1 and a 6 nm-thick sub-layer of GaInN having an InN molar fraction of 0.03. The electron blocking layer 17 is a 15 nm-thick layer of AlGaN having an AlN molar fraction of 0.15 and doped p-type with about $5\times10^{19}$ cm$^{-3}$ of Mg. The optical waveguide layer 18 is a 100 nm-thick layer of GaN doped p-type with about $5\times10^{19}$ cm$^{-3}$ of Mg. The cladding layer 19 is a 500 nm-thick layer of AlGaN having an AlN molar fraction of 0.06 and doped p-type with about $5\times10^{19}$ cm$^{-3}$ of Mg. The p-contact layer 20 is a 100 nm-thick layer of GaN doped p-type with about $1\times10^{20}$ cm$^{-3}$ of Mg.

An improved nitride semiconductor layer structure from which can be made nitride semiconductor lasers that generate light having a far-field pattern that exhibits a single peak is described in Japanese Patent Application no. H10-313993 (the prior application). The prior application is assigned to the assignee of this application and was filed on Oct. 16, 1998. An English language version of the prior application is published as International Application no. WO 00/24097. The prior application is incorporated into this disclosure by reference.

The nitride semiconductor layer structure disclosed in the prior application lacks the electron blocking layer 17 of the layer structure shown in FIG. 1, but includes an additional buffer layer located between the n-type GaN contact layer 13 and the n-type AlGaN cladding layer 14. The additional buffer layer is a layer of low-temperature-deposited semiconductor material that includes AlN. The additional buffer layer enables the n-type AlGaN cladding layer 14 grown on it to have an increased thickness and a lower incidence of cracks. In the nitride semiconductor layer structure disclosed in the prior application, either or both of the thickness of the cladding layer and the AlN molar fraction of the cladding layer can be adjusted to make the light emitted by a laser fabricated using the layer structure to have a far-field pattern, i.e., the intensity distribution in the far field, that exhibits a single peak.

Although the layer structure disclosed in the prior application can be used to fabricate lasers that generate light whose far-field pattern exhibits a single peak and that have a greater efficiency than conventional nitride semiconductor lasers, the need exists for high-quality lasers having a simpler structure.

Thus, what is needed is a nitride semiconductor layer structure that has a simple structure and from which a nitride semiconductor laser can be fabricated that generates light whose far-field pattern exhibits a single peak, and that has a low threshold current and a low power consumption.

What is also needed is a nitride semiconductor layer structure capable of providing increased optical confinement, that has a reduced manufacturing cost and that provides improved performance in opto-electric devices, other waveguide structures and other semiconductor devices.

SUMMARY OF THE INVENTION

The invention provides a nitride semiconductor layer structure that comprises a buffer layer and a composite layer on the buffer layer. The buffer layer is a layer of a low-temperature-deposited nitride semiconductor material that includes AlN. The composite layer is a layer of a single-crystal nitride semiconductor material that includes AlN. The composite layer includes a first sub-layer adjacent the buffer layer and a second sub-layer over the first sub-layer. The single-crystal nitride semiconductor material of the composite layer has a first AlN molar fraction in the first sub-layer and has a second AlN molar fraction in the second sub-layer. The second AlN molar fraction is greater than the first AlN molar fraction.

The invention additionally provides a nitride semiconductor laser that comprises a portion of the above-described nitride semiconductor layer structure, and that additionally comprises an optical waveguide layer over the composite layer and an active layer over the optical waveguide layer.

In the simple nitride semiconductor layer structure provided by the invention, the thick, composite AlGaN layer may be doped p-type or n-type. The composite AlGaN layer has an AlN molar fraction that changes through the thickness of the layer to define two sub-layers in the composite AlGaN layer. The different AlN fractions of the sub-layers optimize the characteristics of the sub-layers to enable the sub-layers to function as a cladding layer and as a contact layer. Accordingly, the sub-layers will be called a cladding sub-layer and a contact sub-layer, respectively. The cladding sub-layer and an optical waveguide layer located over the composite AlGaN layer form an optical confinement structure that provides adequate optical confinement. The composite AlGaN layer has a relatively high AlN molar fraction in the cladding sub-layer. The composite AlGaN layer has a relatively low AlN molar fraction in the contact sub-layer to give the contact sub-layer the high conductivity required for it to effect lateral current injection without an excessive forward voltage drop. Providing the functions of the contact layer and the cladding layer in a composite layer of a material in which only the AlN molar fraction differs provides a substantial reduction in the incidence of cracking in the nitride semiconductor layer structure.

The nitride semiconductor lasers according to the invention fabricated from the above-described nitride semiconductor layer structure have a high production yield because the composite AlGaN layer has a low incidence of cracks despite its substantial thickness. Such lasers generate light whose far-field pattern exhibits a single peak because of the ample optical confinement resulting from the relatively large AlN molar fraction and thickness of the cladding sub-layer of the composite AlGaN layer. Such lasers also have a low forward voltage drop because of the high conductivity and substantial thickness of the n-contact sub-layer of the composite AlGaN layer.

Because lasers according to the invention generate light whose far-field pattern exhibits a single peak, such lasers are ideal for use in optical information recording devices and other applications that require a single-peak emission profile. Also, since such lasers have a greatly-reduced forward voltage drop, a lower power consumption and dissipate less heat, they have a significantly increased service life.

BRIEF DESCRIPTION OF THE DRAWINGS

FIG. 5 is a graph showing the far-field pattern of the light emitted by an example of a nitride semiconductor laser according to the invention fabricated using the nitrides semiconductor layer structure according to the invention.

FIG. 6 is a graph showing the forward characteristics of an example of a nitride semiconductor laser according to the invention (curve (a)) and a comparison laser (curve (b)).

FIG. 7 is a graph showing the threshold characteristics of an example of a nitride semiconductor laser according to the invention (curve (a)) and a comparison laser (curve (b)).

DETAILED DESCRIPTION OF THE INVENTION

Figures 1, 2:
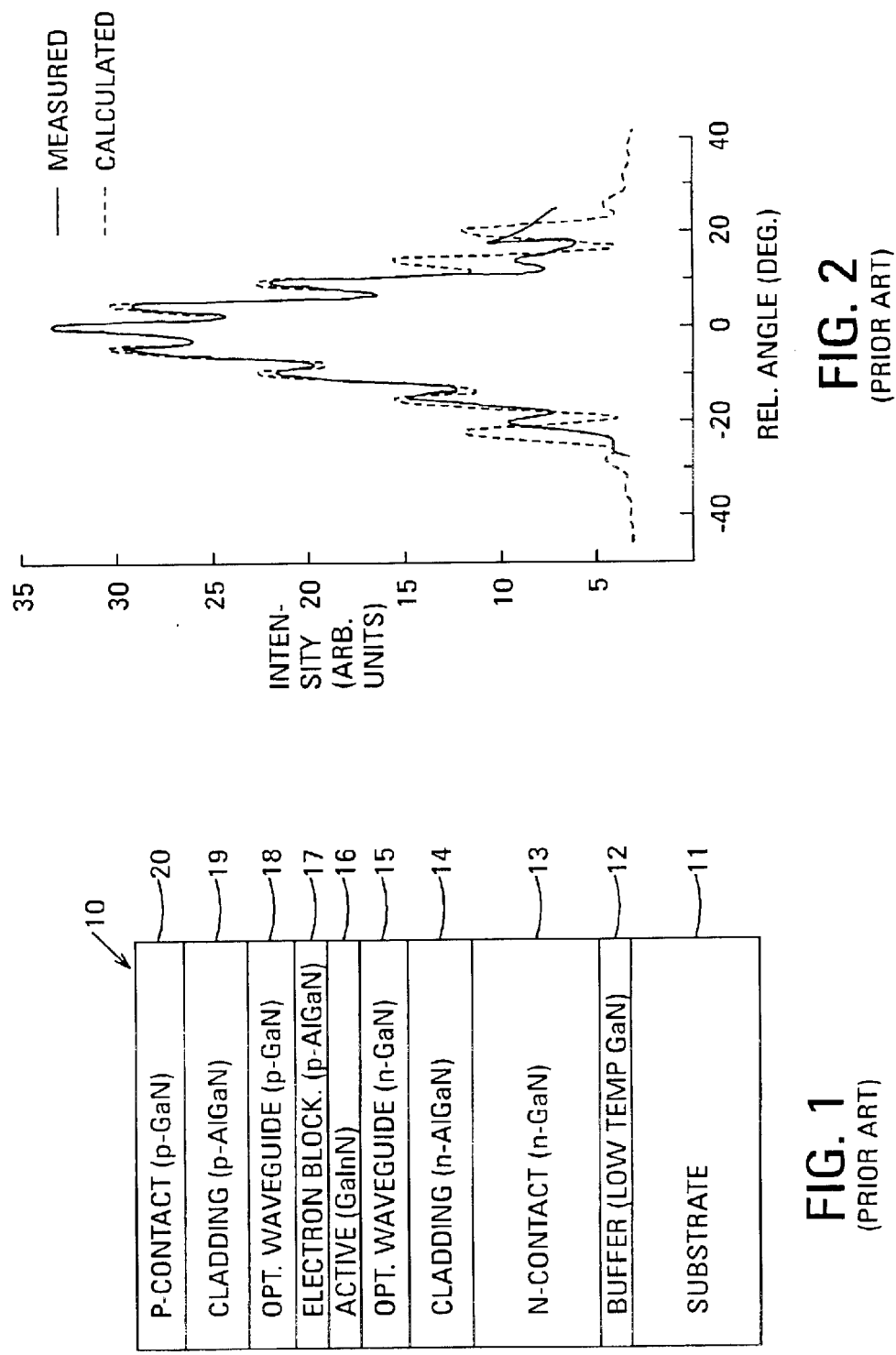
FIG. 1 is a schematic side view of the structure of a conventional GaN-based layer structure from which conventional nitride semiconductor layers can be made.
FIG. 2 is a graph showing the far-field pattern of the light emitted by an example of a laser made from the conventional layer structure shown in FIG. 1.

In the conventional nitride semiconductor layer structure 10 shown in FIG. 1, the lattice mismatch between the AlGaN of the cladding layer 14 and the GaN of the contact layer 13 can cause cracks to occur in the cladding layer and in the layers grown on this layer. Such cracks significantly diminish the manufacturing yield of lasers made from the conventional layer structure shown. To reduce the incidence of cracking, the thickness of the cladding layer 14 is conventionally limited to 600 nm, and the AlN molar fraction of the semiconductor material of the cladding layer 14 is conventionally limited to 0.06. However, the optical waveguide layer 15 and an embodiment of the cladding layer 14 that conforms to the above-described limits form an optical confinement structure having inadequate optical confinement, as illustrated in FIG. 2.

FIG. 2 is a graph showing the far-field pattern of the light emitted by an example of a laser made from the conventional nitride semiconductor layer structure 10 in which the cladding layer 14 conforms to the above-described limits. In FIG. 2, the intensity of the light emitted by the laser, in arbitrary units, is plotted on the y-axis, and the angle, in degrees relative to the optical axis of the laser, at which light is emitted by the laser is plotted the x-axis. The far-field pattern exhibits multiple peaks. This indicates that the optical confinement provided by the above-described optical confinement structure is in, and that light is present in the n-contact layer 13. The example of the laser whose far-field pattern is shown in FIG. 2 has an optical confinement factor of 2.7%.

The prior application referred to above discloses a nitride semiconductor layer structure that can be used to fabricate nitride semiconductor lasers. In the layer structure disclosed in the prior application, the incidence of cracks was reduced by inserting an additional 30 nm-thick buffer layer of low-temperature-deposited semiconductor material between the GaN n-contact layer 13 and the AlGaN cladding layer 14. The additional buffer layer enabled the thickness of the cladding layer 14 to be increased to 1 μm and the AlN molar fraction of the semiconductor material of the cladding layer 14 to be increased to 0.1 without significant cracking occurring in the cladding layer. Such cladding layer enabled the optical confinement structure to provide sufficient optical confinement for the laser to generate light whose far-field pattern exhibited a single peak. Nevertheless, as noted above, it is desired to obtain similar results using a structure and manufacturing process that are simpler than those disclosed in the prior application.

A first approach to simplifying the structure and manufacturing process disclosed in the prior application while retaining the advantages thereof would be to replace the GaN n-contact layer, the additional buffer layer and the AlGaN cladding layer with a single, thick, homogeneous layer of n-type single-crystal AlGaN semiconductor material that serves as a combined n-contact layer and cladding layer. The material of the single AlGaN layer would have a relatively high AlN molar fraction to enable the single AlGaN layer and the optical waveguide layer 15 to form an optical confinement structure that provides adequate optical confinement. For the purposes of this disclosure, an optical confinement structure will be regarded providing adequate optical confinement when a laser that incorporates the optical confinement structure generates light whose far-field pattern exhibits a single peak.

However, the material of the single AlGaN layer having an AlN molar fraction high enough for such layer to form an optical confinement structure that provides adequate optical confinement would cause the bulk resistance of the material and contact resistivity of the single AlGaN layer to be unacceptably high. This would prevent the single AlGaN layer from serving as an effective lateral current injection layer and would cause an acceptably-high voltage drop across the laser.

The invention overcomes this problem by using a composite layer of AlGaN to serve as the n-contact layer and the cladding layer. Such composite layer of AlGaN will be called a composite AlGaN layer. The composite AlGaN layer includes sub-layers each having a different AlN molar fraction, i.e., a sub-layer of single-crystal AlGaN semiconductor material having a lower AlN molar fraction, and a sub-layer of single-crystal AlGaN semiconductor material having a higher AlN molar fraction. The sub-layer having the lower AlN molar fraction has a relatively low resistance, is located adjacent the buffer layer of low-temperature deposited AlGaN, serves as the contact layer to perform lateral current injection into the laser and will be called the AlGaN n-contact sub-layer. The sub-layer having the higher AlN molar fraction is located adjacent the n-type GaN optical waveguide layer and forms an optical confinement structure with the n-type GaN optical waveguide layer. This sub-layer will be called the AlGaN cladding sub-layer. The AlGaN cladding sub-layer has a higher resistance and a substantially smaller thickness than the AlGaN n-contact sub-layer. Although the material of the AlGaN cladding sub-layer has a greater AlN molar fraction, and therefore a higher resistivity, than that of the AlGaN p-contact sub-layer, the substantially smaller thickness of the AlGaN cladding sub-layer prevents the higher resistivity of this sub-layer from significantly increasing the overall resistance of the path between the n-electrode and the active region.

In the composite AlGaN layer, the AlN molar fraction may change abruptly between the AlGaN n-contact sub-layer and the AlGaN cladding sub-layer, creating in effect two distinct layers of AlGaN, each having the different AlN molar fraction. Alternatively, the AlN molar fraction may change gradually between the AlGaN n-contact sub-layer and the AlGaN cladding sub-layer creating a single layer having an AlN molar fraction that differs through the thickness of the layer. Regardless of the way in which the AlN molar fraction changes, the thickness of the AlGaN cladding sub-layer should be no greater than that required to provide adequate optical confinement.

Compared with the layer structure shown in FIG. 1, a nitride semiconductor layer structure that includes a single composite AlGaN layer having sub-layers with different AlN molar fractions, as just described, provides a substantially increased optical confinement. Moreover, the lattice mismatch between the sub-layers of the composite layer is small, so the incidence of cracks in the layer structure is substantially less. These advantages are obtained at the expense of only a small increase in the electrical resistance of the path between the n-contact and the active region.

To reduce the incidence of cracks the nitride semiconductor layer structure according to the invention, it is preferable for the AlN molar fraction of the AlGaN n-contact sub-layer, i.e., the sub-layer having the lower AlN molar fraction, to be at least 0.01. Moreover, to reduce the incidence of cracks and to reduce the resistance of the path between the n-contact and the active layer, the difference between the AlN molar fraction of the AlGaN cladding sub-layer and that of the AlGaN n-contact sub-layer is preferably in the range from 0.03 to 0.10. The actual preferred difference depends on the AlN molar fraction of the AlGaN cladding sub-layer. The AlN molar fraction of the AlGaN cladding sub-layer should be at least 0.05, and may be as high as unity (1).

When the nitride semiconductor layer structure incorporating a composite AlGaN layer that includes two sub-layers of AlGaN having different AlN molar fractions, as just described, has been formed, parts of the layers grown over part of the n-AlGaN contact sub-layer are etched away using reactive ion etching (RIE) or some other suitable etching process to expose the AlGaN n-contact sub-layer. An n-electrode can then be deposited on the surface of the AlGaN n-contact sub-layer exposed by the etching process. A p-electrode is deposited on the surface of the p-contact layer. The layer structure is further etched to remove parts of the p-contact layer, the p-type cladding layer and the p-type optical waveguide to define a ridge structure. The layer structure is then cleaved to form individual lasers. Each nitride semiconductor laser formed as just described incorporates a portion of the nitride semiconductor layer structure.

In an example of the nitride semiconductor layer structure according to the invention in which the AlN molar fraction changed abruptly between the AlGaN n-contact sub-layer and the AlGaN cladding sub-layer, the thickness of the AlGaN n-contact sub-layer, i.e., the layer of AlGaN having the lower AlN molar fraction, was 3 μm, and the AlN molar fraction in this layer was 0.03. The thickness of the AlGaN cladding sub-layer, i.e., the layer of AlGaN having the higher AlN molar fraction, was 1 μm and the AlN molar fraction in this layer was 0.06. A low incidence of cracks was observed in the surface of a test sample of such a layer structure fabricated a 50 mm-diameter substrate.

Figure 3:
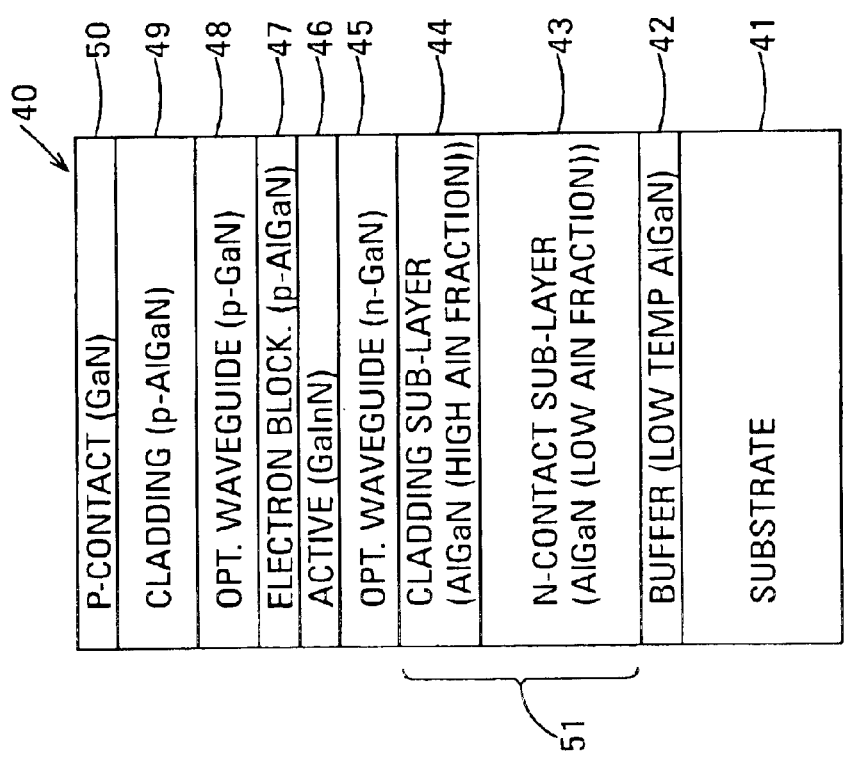
FIG. 3 is a schematic side view of a first embodiment of a nitride semiconductor laser structure according to the invention.

An example of a nitride semiconductor layer structure according to the invention will now be described with reference to FIG. 3. FIG. 3 is a schematic side view of a first embodiment 40 of a nitride semiconductor layer structure according to the invention. Nitride semiconductor lasers according to the invention and other semiconductor devices can be made from the layer structure 40, as will be described below. In the example shown, the AlN molar fraction in the composite AlGaN layer 51 changes abruptly between the AlGaN n-contact sub-layer 43 and the AlGaN cladding sub-layer 44, as will be described below with reference to FIG. 9A.

The layer structure 40 is composed of the sapphire substrate 41 having a C-plane (0001) surface. Successively deposited over this surface by metalorganic vapor phase epitaxy (MOVPE) are the AlGaN low-temperature-deposited buffer layer 42; the composite n-type AlGaN layer 51 composed of the n-contact sub-layer 43 in which the AlGaN has a lower AlN molar fraction and the AlGaN cladding sub-layer 44 in which the AlGaN has a higher AlN molar fraction; the n-type GaN optical waveguide layer 45; the GaInN active layer 46; the p-type electron blocking layer 47; the p-type GaN optical waveguide layer 48; the p-type AlGaN cladding layer 49 and the p-type GaN p-contact layer 50.

The nitride semiconductor layer structure 40 will now be described in further detail. The buffer layer 42 is a 30 nm-thick layer of low-temperature deposited AlGaN having an AlN molar fraction of 0.03 and deposited at a temperature of 500° C. The material of the buffer layer is deposited at a temperature below that at which single-crystal growth occurs. When deposited, the buffer layer is composed of a mixture of amorphous and polycrystalline material. As will be described in more detail below, the substrate and the buffer layer are then heated to a temperature above that at which single-crystal growth occurs prior to depositing the composite AlGaN layer 51. This anneals the low-temperature deposited material of the buffer layer, and causes single-crystal regions to develop in the buffer layer. As a result, the composite AlGaN layer grows epitaxially on the buffer layer. However, in the finished layer structure 40, regions of residual polycrystalline, amorphous, or polycrystalline and amorphous material distinguish the buffer layer 42 from the single-crystal material of the composite AlGaN layer 51 deposited on the buffer layer.

Although the buffer layer 42 is described above as a 30 nm-thick layer of low-temperature deposited AlGaN having an AlN molar fraction of 0.03, the thickness of the buffer layer may be as great as 100 nm and the AlN molar fraction may be as great as unity (1). The composite AlGaN layer 51 is a 4μ-thick layer of AlGaN doped n-type with about $1 \times 10^{18}$ cm$^{-3}$ of Si and deposited at a temperature of 1050° C. The composite layer is composed of the n-AlGaN contact layer 43, which is a 3 μm-thick layer of AlGaN having an AlN molar fraction of 0.03, and the AlGaN cladding sub-layer 44, which is a 1 μm-thick layer of AlGaN having an AlN molar fraction of 0.06. In the example shown, the change in the AlN molar fraction between the AlGaN n-contact sub-layer 43 and the AlGaN cladding sub-layer 44 is abrupt.

The optical waveguide layer 45 is a 100 nm-thick layer of GaN doped n-type with about $1 \times 10^{18}$ cm$^{-3}$ of Si and deposited at a temperature of 1050° C.

The active layer 46 is composed of five pairs of layers of undoped GaInN deposited at a temperature of 800° C. Each pair of layers is composed of a 3 nm-thick layer of GaInN with an InN molar fraction of 0.1 and a 6 nm-thick layer of GaInN with an InN molar fraction of 0.03.

The electron blocking layer 47 is a 15 nm-thick layer of AlGaN having an AlN molar fraction of 0.15 doped p-type with about $5 \times 10^{19}$ cm$^{-3}$ of Mg and deposited at a temperature of 800° C.

The optical waveguide layer 48 is a 100 nm-thick layer of GaN doped p-type with about $5 \times 10^{19}$ cm$^{-3}$ of Mg and deposited at a temperature of 1050° C.

The cladding layer 49 is a 500 nm-thick layer of AlGaN having an AlN molar fraction of 0.06, doped p-type with about $5 \times 10^{19}$ cm$^{-3}$ of Mg and deposited at a temperature of 1050° C.

The p-contact layer 50 is a 100 nm-thick layer of GaN doped p-type with about $1 \times 10^{20}$ cm$^{-3}$ of Mg and deposited at a temperature of 1050° C.

Figure 4:
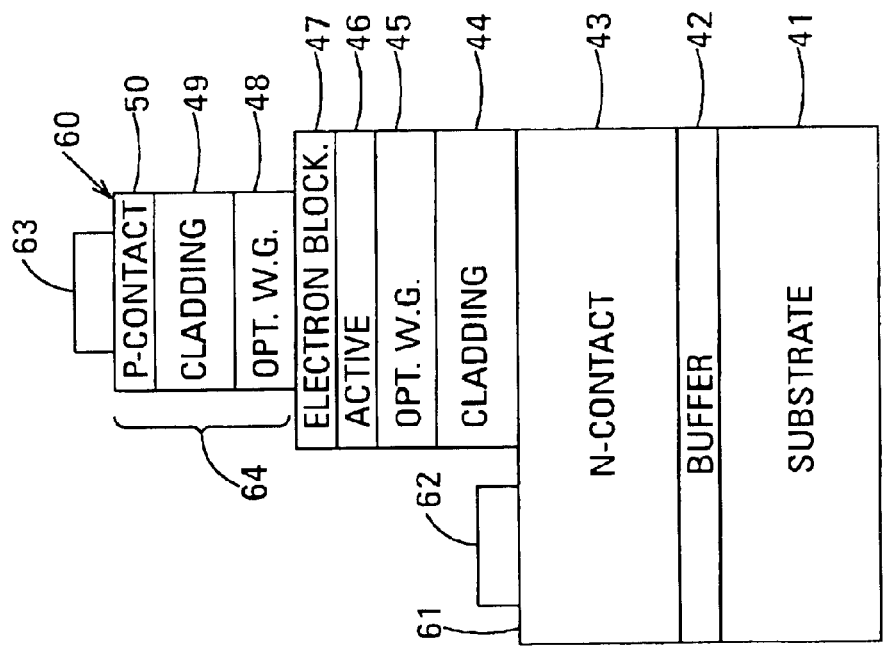
FIG. 4 is a schematic side view of a nitride semiconductor laser according to the invention fabricated from the nitride semiconductor layer structure shown in FIG. 3.

FIG. 4 is a schematic side view of the nitride semiconductor laser 60. The laser 60 is one of many lasers fabricated from the nitride semiconductor layer structure 40 so that each laser incorporates a portion of the layer structure 40. Elements of the layer structure that appear in the laser are indicated using the same reference numerals.

In the laser 60, the part of the layer structure overlaying part of the AlGaN n-contact sub-layer 43 is etched away to expose the surface 61 and the n-electrode 62 is formed on the surface 61. The laser additionally includes the p-electrode 63 located on the surface of the p-contact layer 50. Finally, parts of the optical waveguide layer 48, the cladding layer 49 and the p-contact layer 50 are etched away to form the ridge structure 64 that concentrates the current flow through the active layer 46.

An example of a method that can be used to make the nitride semiconductor layer structure 40 according to the invention will now be described with reference to FIG. 3.

The substrate 41, which is preferably a sapphire substrate having a 0001 (C) surface, was provided. The substrate was cleaned by immersing it in hydrofluoric acid and then in aqua regia for five minutes each, and was then rinsed in pure water for five minutes. The substrate was then washed in methanol and acetone for five minutes each, and was then rinsed in pure water for another five minutes. The operations just described were all performed at room temperature.

The substrate 41 was transferred to the reactor of a metal-organic vapor phase epitaxy (MOVPE) apparatus. The atmosphere in the reactor was replaced with dry nitrogen to remove oxygen and water vapor. Then, hydrogen was introduced and the substrate was cleaned by heating it to 1100° C. for ten minutes.

The temperature of the substrate 41 was reduced to 500° C. Trimethylaluminum (TMAl), trimethylgallium (TMGa) and ammonia were supplied to the reactor to start depositing the buffer layer 42 of low-temperature-deposited AlGaN on the substrate 41.

When the material of the substrate 41 is conductive, as in the case of a GaN substrate, a substrate structure that includes a GaN layer, or a SiC substrate, silane can additionally be supplied to the reactor to dope the low-temperature-deposited AlGaN of the buffer layer 42 n-type with silicon. The flow rate of the silane is set to give a silicon concentration in the range from about $5 \times 10^{17}$ to about $5 \times 10^{19}$ cm$^{-3}$. In one exemplary embodiment, the flow rate of the silane was set to give a silicon concentration of about $1 \times 10^{18}$ cm$^{-3}$. Doping the buffer layer 42 reduces the electrical resistivity of the buffer layer to a value allows the drive current for the laser 60 to flow through the buffer layer with a negligible voltage drop.

The flow of gasses to the reactor was continued for approximately three minutes to deposit the buffer layer 42 to a thickness of 30 nm on the substrate 41.

When the buffer layer 42 reached its design thickness of 30 nm, the supply of TMAl and TMGa and, if it was being supplied to the reactor, silane were stopped. The temperature of the substrate 41 was then raised to 1050° C. and was held at this temperature for approximately five minutes.

The supply of TMAl, TMGa and silane was re-commenced to start growing the composite AlGaN layer 51. First, the gasses were supplied at relative flow rates that generated the AlGaN n-contact sub-layer 43 with an AlN molar fraction of 0.03. The flow of gasses was continued until the AlGaN n-contact sub-layer 43 reached a thickness of 3 µm. The relative flow rate between the TMAl and TMGa was then changed to start growing the n-AlGaN cladding sub-layer 44 with an AlN molar fraction of 0.06. The flow of gasses was continued until the n-AlGaN cladding sub-layer reached a thickness of 1 µm.

When complete, the composite AlGaN layer 51 had a total thickness of 4 µm. A layer of this overall thickness can be formed with a low incidence of cracks because of the buffer layer 42 of low-temperature-deposited AlGaN located directly beneath it and because of the small lattice mismatch between the AlGaN n-contact sub-layer 43 and the AlGaN contact sub-layer 44 constituting the composite layer.

The flow rate of the silane to the reactor was adjusted to dope the composite AlGaN layer 51 with silicon at a concentration in the range from about $5 \times 10^{17}$ to about $5 \times 10^{19}$ cm$^{-3}$. In a preferred embodiment, the flow rate was set to give a silicon dopant concentration of $1 \times 10^{18}$ cm$^{-3}$. The conductivity of a doped layer depends on the sum of the dopant concentration and the carrier mobility. Consequently, the resistance of the layer cannot be decreased simply by raising the dopant concentration. The optimum dopant concentration is that which minimizes the resistance of the layer.

When the AlGaN cladding sub-layer 44 reached its design thickness, the temperature of the substrate 41 was held at 1050° C. and the supply of only the TMAl was stopped to grow the n-type GaN optical waveguide layer 45. The flow rate of the silane was adjusted to dope the optical waveguide layer 45 with silicon at a concentration of $1 \times 10^{18}$ cm$^{-3}$. The growth rate was about 40 nm per minute. The flow of gasses was continued until the optical waveguide layer 45 reached a thickness of 100 nm. When the optical waveguide layer 45 reached its design thickness, the supply of TMGa and silane was stopped, but the supply of ammonia was continued. The temperature of the sapphire substrate was then reduced to 800° C.

In the example just described, the n-type GaN optical waveguide layer 45 was doped with silicon at a concentration of $1 \times 10^{18}$ cm$^{-3}$. Using a higher silicon concentration will reduce the resistivity of the optical waveguide layer but will degrade the crystallinity of the layer. In view of this, the preferred silicon concentration is in the range from about $5 \times 10^{17}$ cm$^{-3}$ to about $1 \times 10^{19}$ cm$^{-3}$, centering on about $2 \times 10^{18}$ cm$^{-3}$.

The dopant concentrations in the AlGaN n-contact sub-layer 43, the AlGaN cladding sub-layer 44 and the optical waveguide layer 45 may differ from each other, or two or more may be the same. However, the manufacturing process is simplified when the dopant concentrations in all the layers are more or less the same.

When the temperature of the substrate 41 reached 800° C., TMGa and trimethylindium (TMIn) were supplied to the reactor to grow the active layer 46. The active layer is composed of multiple quantum wells formed by growing five pairs of sub-layers. Each pair of sub-layers is composed of a 3 nm-thick sub-layer of GaInN having an InN molar fraction of 0.1 and a 6 nm-thick sub-layer of GaInN having an InN molar fraction of 0.03. The InN molar fractions are determined by the wavelength of the light generated by the lasers that will be fabricated from the layer structure 40. The InN molar fractions shown in this example correspond to a wavelength of 400 nm. The gasses were supplied to the reactor at relative flow rates that generated the sub-layers of the active layer with the InN molar fractions shown. The growth rate typically ranges from 3 to 6 nm per minute, but was 5 nm per minute under the conditions described here.

Once the last sub-layer of the active layer 46 reached its design thickness, the supply of TMIn was stopped, and TMAl and biscyclopentadienyl magnesium (Cp$_2$Mg) were supplied to the reactor to grow the p-type AlGaN electron blocking layer 47. The gasses were supplied at relative flow rates that generated the electron blocking layer with an AlN molar fraction of 0.15. The flow rate of the Cp$_2$Mg was adjusted to give a magnesium concentration in the range from about $1 \times 10^{18}$ to about $1 \times 10^{20}$ cm$^{-3}$. In a preferred embodiment, the Cp$_2$Mg flow rate was set to give a magnesium dopant concentration of $5 \times 10^{19}$ cm$^{-3}$. The range of the magnesium concentration is determined in the same manner as the range of the silicon concentration discussed above.

The flow of gasses was continued until the p-type AlGaN electron blocking layer 47 reached a thickness of 15 nm.

When the p-type AlGaN electron blocking layer 47 reached its design thickness, the supply of TMAl and Cp$_2$Mg was stopped and the temperature of the substrate 41 was increased. When the temperature of the substrate reached 1050° C., TMGa and Cp$_2$Mg were supplied to the reactor to start growing the p-type GaN optical waveguide layer 48. Under the above-described conditions, the growth rate of the p-type GaN optical waveguide layer 48 was 2 µm per hour. The flow rate of the Cp$_2$Mg was adjusted to give a magnesium concentration in the range from $1 \times 10^{18}$ to $1 \times 10^{20}$ cm$^{-3}$. Too high a magnesium concentration will degrade the crystallinity of the material of the p-type GaN optical waveguide layer. In a preferred embodiment, the flow rate of the Cp$_2$Mg was set to give a magnesium concentration of about $5 \times 10^{19}$ cm$^{-3}$.

The flow of gasses was continued until the p-type GaN optical waveguide layer 48 reached a thickness of 100 nm.

When the p-type GaN optical waveguide layer 48 reached its design thickness, TMAl was additionally supplied to the reactor to start growing the p-type AlGaN cladding layer 49. The relative flow rates of the TMAl and TMGa were set to give an AlN molar fraction of 0.06. The flow rate of the Cp$_2$Mg was set to give a magnesium concentration in the range from $1 \times 10^{18}$ to $1 \times 10^{20}$ cm$^{-3}$. In a preferred embodiment, the Cp$_2$Mg flow rate was set to give a magnesium concentration of about $5 \times 10^{19}$ cm$^{-3}$.

The magnesium dopant concentrations may differ in the p-type GaN optical waveguide layer 48 and the p-type AlGaN cladding layer 49, but the fabrication process is simpler if the dopant concentrations are the same.

The flow of gasses was continued until the p-type AlGaN cladding layer 49 reached a thickness of 500 nm.

When the p-type AlGaN cladding layer 49 reached its design thickness, the supply of TMAl was stopped to start growing the p-type GaN p-contact layer 50. Under the above-described conditions, the growth rate of the p-contact layer was 2.5 µm per hour. The flow rate of the Cp$_2$Mg was set to give a magnesium concentration of about $1 \times 10^{20}$ cm$^{-3}$. The flow of gasses was continued until the p-contact layer reached a thickness of 100 nm.

When the p-type GaN p-contact layer 50 reached its design thickness, the supply of TMAl, TMGa and Cp$_2$Mg to the reactor was stopped and the temperature of the substrate 41 was reduced. The supply of ammonia to the reactor was stopped when the temperature of the substrate fell below 100° C., and the layer structure 40 was removed from the reactor. The surface of the layer structure was observed using a differential interference microscope to check for cracks.

Lasers similar to the laser 60 shown in FIG. 4 were then fabricated from the layer structure 40 as follows. The layer structure was selectively etched to expose the surface 61 of the AlGaN n-contact sub-layer 43 of each laser and was additionally etched to form the ridge structure 64 of each laser. The ridge structure concentrates the current flow through the active layer 46. The n-electrodes 62 of the lasers were then formed in a conventional manner by vapor deposition. In a preferred embodiment, titanium/aluminum n-electrodes were formed.

Prior to forming the p-electrodes 63 of the lasers, p-type conversion of the magnesium-doped layers was promoted using conventional thermal annealing or electron beam irradiation. Annealing may also be performed before the n-electrodes 62 are formed, but in this example annealing was performed after the n-electrodes were formed. The annealing process can be performed by the method described in Japanese Patent Application H9-37705, assigned to the assignee of this disclosure and incorporated into this disclosure by reference. An English language version of this application is published as International Application no. WO 98/37586. The p-electrodes 63 of the lasers were then formed on the p-type GaN contact layers 49 of the lasers. In a preferred embodiment, the p-electrodes were formed from Ni/Au and each had a width of 5 μm and a length of 500 μm.

After the n- and p-electrodes were formed, a cleaving operation was performed to divide the layer structure 40 into individual lasers 60 each having a resonator structure.

FIG. 5 is a graph showing the far-field pattern of the light emitted by an example of the laser 60 shown in FIG. 4 fabricated from the layer structure 40 as just described. In FIG. 5, the intensity of the light emitted by the laser, in arbitrary units, is plotted on the y-axis, and the relative emission angle of the light is plotted the x-axis. The relative emission angle is the angle, in degrees relative to the optical axis of the laser, at which the light is emitted by the laser. The far-field pattern exhibits a single peak, which indicates that the optical confinement structure composed of the optical waveguide layer 45 and the AlGaN cladding sub-layer 44 of the composite AlGaN layer 51 provides adequate optical confinement. In the example shown, the optical confinement factor was 3.2%.

Other characteristics of the laser 60 are shown in FIGS. 6 and 7. FIG. 6 is a graph showing the forward conduction characteristic of the laser. In this, the voltage drop across the laser is plotted along the y-axis and the current through the laser is plotted along the x-axis. The forward characteristic of the laser 60 is indicated by curve (a). FIG. 7 is a graph of the threshold characteristic of the laser. In this, the intensity of the light emitted by the laser in arbitrary units is plotted on the y-axis and the current through the laser is plotted along the x-axis. The threshold characteristic of the laser 60 is indicated by curve (a).

Two additional lasers were fabricated for comparison with the laser 60. The first laser fabricated for comparison, called Comparative Example 1, had the structure shown in FIG. 4.

However, the AlN molar fraction of the AlGaN n-contact sub-layer 43 and the AlN molar fraction of the low-temperature-deposited AlGaN of the buffer layer 42 were both 0.06. In the laser 60, these AlN molar fractions were both 0.03. The forward characteristic of Comparative Example 1 is shown in curve (b) in FIG. 6. Comparing curve (a) (the laser 60 according to the invention) with curve (b) (Comparative Example 1) in FIG. 6 shows the substantial advantage obtained in the laser 60 by the lower AlN molar fraction in the AlGaN n-contact sub-layer 43. For a given current, the voltage drop across the laser 60 according to the invention is substantially less than the voltage drop across Comparative Example 1.

The second laser fabricated for comparison, called Comparative Example 2, had the structure shown in FIG. 1. The n-type GaN contact layer 13 had a thickness of 4 μm. The GaN material of the n-type GaN contact layer limited the thickness of the n-type AlGaN cladding layer 14 deposited on this layer to 600 nm, compared with the 1000 nm thickness of the n-type AlGaN cladding sub-layer 44 deposited on the AlGaN n-contact sub-layer 43 in the laser 60. The thickness of the cladding layer in Comparative Example 2 was limited to 600 nm to reduce the incidence of cracks in the cladding layer, as described above. The threshold characteristic of Comparative Example 2 is shown in curve (b) of FIG. 7. Curve (b) of FIG. 7 indicates that the threshold current of Comparison Example 2 was approximately 300 mA, whereas curve (a) of FIG. 7 indicates that the threshold current of the laser 60 according to the invention was approximately 200 mA. Moreover, the farfield pattern of the light emitted by Comparative Example 2 exhibited multiple peaks, as shown in FIG. 2, whereas the light emitted by the laser 60 according to the invention exhibited the single peak shown in FIG. 5.

Figure 10:
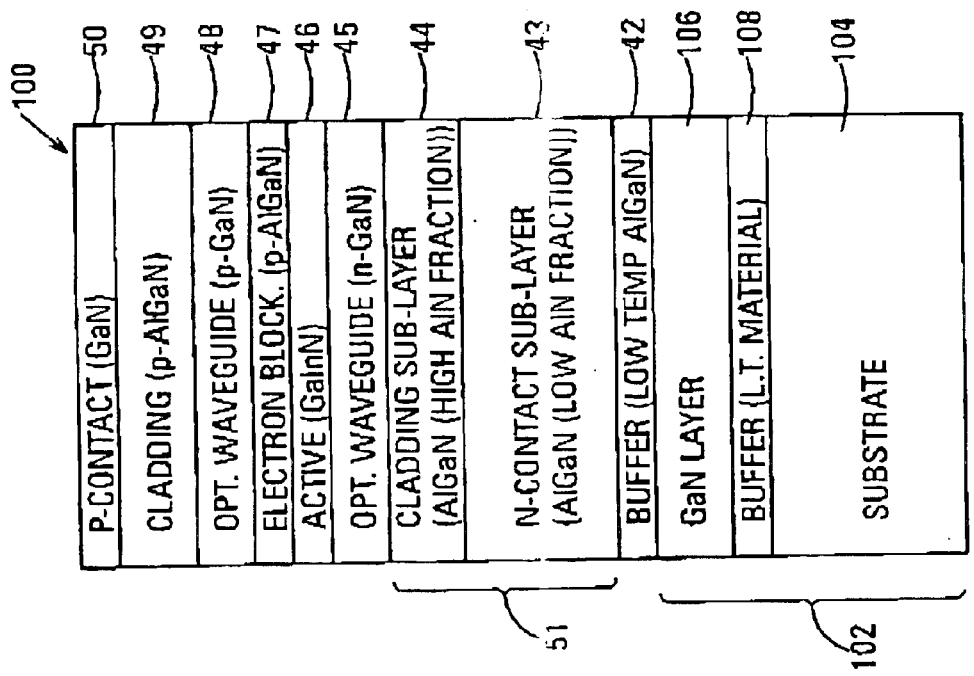

Sapphire substrates, as used as the substrate 41 of the layer structure 40 and the laser 60, are well-researched and inexpensive. Alternatively, silicon carbide (SiC) can be used as the substrate 41 SiC is a more expensive substrate material, but has a lower resistivity, is more stable, and has superior cleaving properties. As a further alternative, a conductive substrate of GaN can be used and provides excellent performance. Moreover, a substrate structure composed of a layer of GaN deposited on a substrate can be used as a conductive substrate. Such substrate structure may additionally include a buffer layer of low-temperature-deposited nitride semiconductor material between the substrate and the layer of GaN. FIG. 10 shows an embodiment 100 of a nitride semiconductor layer structure in accordance with the invention and incorporating an example of such a substrate structure. Elements of the nitride semiconductor layer structure 100 that correspond to the nitride semiconductor layer structure 40 described above with reference to FIG. 3 are indicated using the same reference numerals and will not be described again here. The nitride semiconductor layer structure 100 includes the substrate structure 102 composed of the substrate 104, the layer 106 of GaN and the buffer layer 108 of low-temperature-deposited nitride semiconductor material between the substrate 104 and the layer 106 of GaN. The substrate structure 102 is disclosed in Japanese Patent Application H9-306215 and U.S. Pat. No. 6,537,513, which claims priority of Japanese Patent Application H9-306215. Japanese Patent Application No. 119-306215 was assigned to the assignee of this disclosure, and is incorporated into this disclosure by reference. An English language version of this application is published as International Application no. WO 99/25030. Other substrate materials that can be used include spinel, MgO, GaAs, silicon, etc.

In the above-described example of the laser 60, the disclosure of the prior application can be used as a reference for varying the AlN molar fraction and thickness of the AlGaN cladding sub-layer to increase the optical confinement factor, to improve the far-field pattern of the light emitted by the laser, and to lower the threshold current.

The layer structure 40 and the laser 60 were described as including the n-type composite AlGaN layer 51 located between the substrate 41 and the active layer 46. The layer structure and the corresponding laser may additionally include an additional p-type composite AlGaN layer located over the active layer, as shown in FIG. 8.

Figure 8:
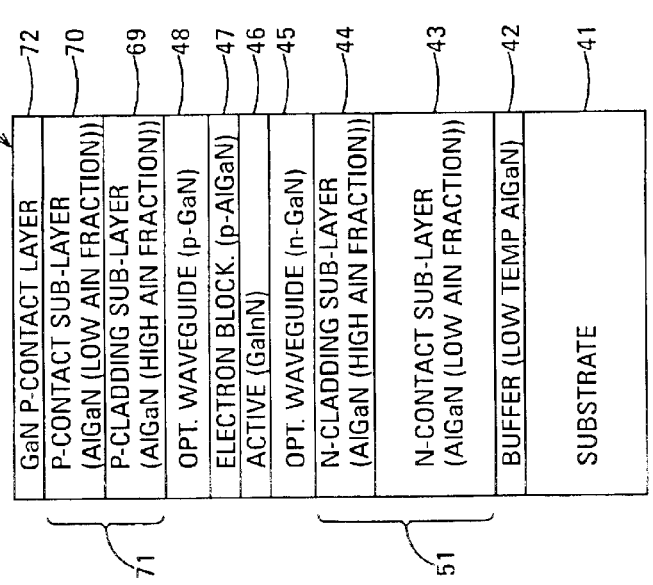
FIG. 8 is a schematic side view of a second embodiment of a nitride semiconductor laser structure according to the invention incorporating an additional AlN composite layer.

FIG. 8 is a schematic side view showing a second embodiment 80 of a nitride semiconductor layer structure according to the invention. The layer structure 80 includes the n-type composite AlGaN layer 51, the p-type composite AlGaN layer 71 and the p-type GaN p-contact layer 72. Elements of the layer structure 80 that correspond to the layer structure 40 are indicated using the same reference numerals and will not be described again here. It will be apparent to the person of ordinary skill in the art that processing similar to that described above may applied to the layer structure 80 to make lasers similar in structure to the laser 60.

In the layer structure 80, the p-type composite AlGaN layer 71 includes two sub-layers of approximately equal thickness, each having a different AlGaN molar fraction. The p-type composite AlGaN layer includes a sub-layer of single-crystal AlGaN semiconductor material having a lower AlN molar fraction and a sub-layer of single-crystal AlGaN semiconductor material having a higher AlN molar fraction. The sub-layer having the higher AlN molar fraction is located adjacent the p-type GaN optical waveguide layer 48 and forms an optical confinement structure with the p-type GaN optical waveguide layer. This sub-layer will be called the AlGaN p-cladding sub-layer 69. The greater AlN molar fraction of the AlGaN p-cladding sub-layer enables the optical confinement structure to provide adequate optical confinement.

The sub-layer having the lower AlN molar fraction has a lower resistance than the AlGaN p-cladding sub-layer 69, is located remote from the p-type GaN optical waveguide layer 48 and performs current injection into the laser. This sub-layer will be called the AlGaN p-contact sub-layer 70. The lesser AlN molar fraction of the AlGaN p-contact layer provides a low-resistance current conduction path.

The n-type composite AlGaN layer 51 and the p-type composite AlGaN layer 71 are oriented in the same sense relative to the optical waveguide layers 45 and 48, i.e., in each of the composite AlGaN layers, the cladding sub-layer having the higher AlN molar fraction is located adjacent the respective optical waveguide layer to form a respective optical confinement structure. As a result, the sub-layers of the n-type composite AlGaN layer 51 and the p-type composite AlGaN layer 71 are in inverse order in the layer structure 80.

In the p-type composite AlGaN layer 71, the AlN molar fraction may change abruptly between the AlGaN p-cladding sub-layer 69 and the AlGaN p-contact sub-layer 70, creating in effect two distinct layers of AlGaN, each having a different AlN molar fraction. Alternatively, the AlN molar fraction may change gradually between the AlGaN p-cladding sub-layer AlGaN and the p-contact sub-layer creating a single p-type layer having an AlN molar fraction that differs through the thickness of the layer. Regardless of the way in which the AlN molar fraction changes, the thickness of the p-cladding sub-layer 69 should be no greater than that required to provide adequate optical confinement.

In a preferred embodiment of the nitride semiconductor layer structure 80, the AlGaN p-cladding sub-layer 69 has a thickness of 500 nm and an AlN molar fraction of 0.06, the AlGaN p-contact sub-layer 70 has a thickness of 500 nm and an AlN molar fraction of 0.03 and the p-type GaN p-contact layer 72 has a thickness of 50 nm. The thicknesses and compositions of the other layers are the same as in the layer structure 40. It will be apparent to a person of ordinary skill in the art that the method described above for making the layer structure 40 can be modified to make the layer structure 80.

The layer structure 40 or the layer structure 80 may be modified to enable it to be used for making n-up lasers and other nitride semiconductor devices. In such modified layer structure, the layers between the substrate 41 and the active layer 46 are doped p-type and the layers over the active layer, including any additional composite AlGaN layer 71, are doped n-type.

The layer structures 40 and 80 and the laser 60 described above may include an additional buffer layer (not shown) of low-temperature-deposited AlGaN sandwiched between the p-type GaN optical waveguide layer 48 and the p-type AlGaN cladding layer 49 or between the p-type GaN optical waveguide layer 48 and the p-type composite AlGaN layer 71, to reduce the incidence of cracks still further. The low-temperature-deposited AlGaN of the additional buffer layer may be doped with magnesium at a concentration in the range from about $1 \times 10^{18}$ to about $1 \times 10^{20}$ cm$^{-3}$ make this material p-type. For instance, a magnesium concentration of about $1 \times 10^{20}$ cm$^{-3}$ can be selected.

The layers constituting the layer structures 40 and 80 are preferably deposited using metal-organic vapor phase epitaxy (MOVPE). However, this is not critical to the invention. These layers may alternatively be deposited using molecular beam epitaxy (MBE), halide vapor phase epitaxy (HVPE) or other suitable epitaxial deposition techniques.

Figure 9A:
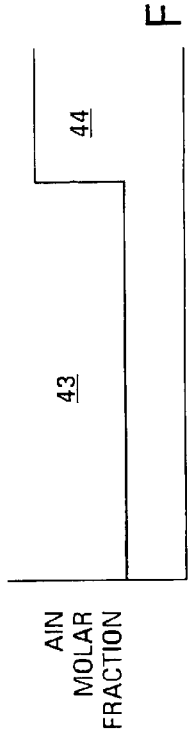
FIGS. 9A–9C are graphs showing different ways in which the A N molar fraction of the composite AlGaN layer can vary through the thickness of the composite AlGaN layer.
Figure 9B:
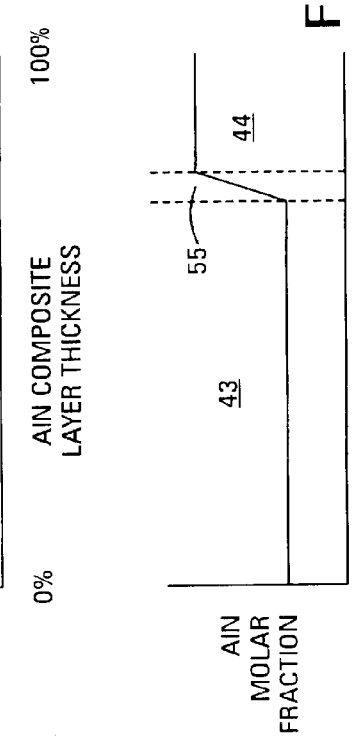
Figure 9C:
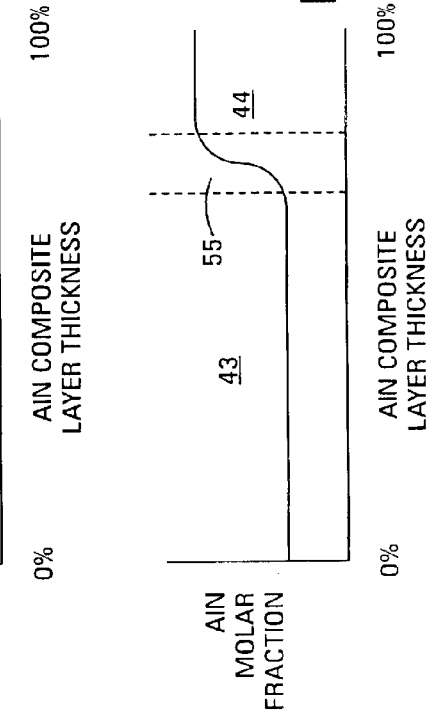

FIGS. 9A–9C are graphs illustrating some of the ways in which the AlN molar fraction can vary through the thickness of the composite AlGaN layer 51. The AlN molar fraction is plotted along they-axis, and the percentage of the thickness of the composite AlGaN layer is plotted along the x-axis, with 0% corresponding to the interface between the composite AlGaN layer and the buffer layer 42 and 100% corresponding to the interface between the composite AlGaN layer and the n-GaN optical waveguide layer 45. The actual percentage of the thickness at which the AlN molar fraction changes depends on the relative thicknesses of the AlGaN n-contact sub-layer 43 and the AlGaN cladding sub-layer 44.

As described above, the AlN molar fraction may change abruptly between the AlGaN n-contact sub-layer 43 and the AlGaN cladding sub-layer 44, creating in effect two distinct sub-layers of AlGaN, each having the different AlN molar fraction, as shown in FIG. 9A.

Alternatively, the AlN molar fraction may change gradually in the gradient sub-layer 55 between the AlGaN n-contact sub-layer 43 and the AlGaN cladding sub-layer 44. FIG. 9B shows an embodiment in which the AlN molar fraction varies substantially linearly across the gradient sub-layer. In this case, the gradient sub-layer is about 20 nm thick. FIG. 9C shows an embodiment in which the AlN molar fraction varies substantially parabolically across the gradient sub-layer. Changing the AlN molar fraction gradually to create the gradient sub-layer should reduce the hetero gap, which should reduce the device resistance.

The AlN molar fraction in the additional composite AlGaN layer 71 may vary between the p-cladding sub-layer 69 and the p-contact sub-layer 70 in ways similar to those shown in FIGS. 9A–9C.

The nitride semiconductor layer structures 40 and 80 according to the invention include the thick, low-resistance composite AlGaN layer 51 and yet have a relatively low incidence of cracks and other defects. These layer structures can be used to improve the characteristics not only of electro-optical devices such as laser diodes, but also of other devices that include Group III-nitride semiconductor hetero structures. Such devices include photodiodes, light-emitting diodes, planar light-emitting diodes, high electron mobility transistors and field-effect transistors.

Although this disclosure describes illustrative embodiments of the invention in detail, it is to be understood that the invention is not limited to the precise embodiments described, and that various modifications may be practiced within the scope of the invention defined by the appended claims.

We claim:

1. A nitride semiconductor layer structure, comprising:
    a buffer layer of a low-temperature-deposited nitride semiconductor material including AlN deposited at a temperature below that which single crystal growth occurs; and
    a composite layer of a single-crystal nitride semiconductor material including AlN on the buffer layer, the composite layer including:
        a first sub-layer adjacent the buffer layer, and
        a second sub-layer over the first sub-layer, in which: the single-crystal nitride semiconductor material has a first AlN molar fraction in the first sub-layer and a second AlN molar fraction in the second sub-layer, the second AlN molar fraction being greater than the first AlN molar fraction.

2. The nitride semiconductor layer structure of claim 1, additionally comprising:
    an additional composite layer of a single-crystal nitride semiconductor material, the additional composite layer including:
        a first additional sub-layer, and
        a second additional sub-layer; and
    an active layer between the composite layer and the additional composite layer, in which:
    the second additional sub-layer is closer to the active layer than is the first additional sub-layer, and
    the single-crystal nitride semiconductor material of the additional composite layer has a first additional AlN molar fraction in the first additional sub-layer and a second additional AlN molar fraction in the second additional sub-layer, the second additional AlN molar fraction being greater than the first additional AlN molar fraction.

3. The nitride semiconductor layer structure of claim 1, in which the second AlN molar fraction differs from the first AlN molar fraction by no more than 0.1.

4. The nitride semiconductor layer structure of claim 3, in which the second AlN molar fraction differs from the first AlN molar fraction by more than 0.03.

5. The nitride semiconductor layer structure of claim 1, additionally comprising a sapphire substrate under the buffer layer.

6. The nitride semiconductor layer structure of claim 1, additionally comprising a substrate under the buffer layer, the substrate including one of SiC and GaN.

7. The nitride semiconductor layer structure of claim 1, additionally comprising a substrate structure under the buffer layer, the substrate structure including:
    a substrate;
    a layer of GaN; and
    a layer of a low-temperature-deposited semiconductor material sandwiched between the substrate and the layer of GaN.

8. The nitride semiconductor layer structure of claim 1, in which the low-temperature-deposited semiconductor material of the buffer layer and the single-crystal nitride semiconductor material of the composite layer are doped with the same dopant.

9. The nitride semiconductor layer structure of claim 1, in which:
    the buffer layer has a thickness $\leq 100$ nm;
    the low-temperature-deposited nitride semiconductor material of the buffer layer is $Al_yGa_{1-y}N$ in which ($0 < y \leq 1$);
    the single-crystal nitride semiconductor material of the composite layer is $Al_xGa_{1-x}N$; and
    the second sub-layer has a thickness of at least 600 nm and the second AlN molar fraction x is in the range ($0.05 < x \leq 1$).

10. The nitride semiconductor layer structure of claim 1, in which the low-temperature-deposited nitride semiconductor material of the buffer layer has an AlN molar fraction of at least 0.01.

11. The nitride semiconductor layer structure of claim 10, in which the single-crystal nitride semiconductor material of the composite layer has an AlN molar fraction at least 0.03.

12. The nitride semiconductor layer structure of claim 1, in which:
    the composite layer additionally includes a gradient sub-layer between the first sub-layer and the second sub-layer; and
    the AlN molar fraction of the single-crystal nitride semiconductor material of the composite layer changes from the first AlN molar fraction to the second AlN molar fraction in the gradient sub-layer.

13. The nitride semiconductor layer structure of claim 12, in which AlN molar fraction of the single-crystal nitride semiconductor material of the composite layer changes from the first AlN molar fraction to the second AlN molar fraction one of (a) linearly and (b) parabolically in the gradient sub-layer.

14. A nitride semiconductor laser, comprising:
    a portion of a nitride semiconductor layer structure according to claim 1;
    an optical waveguide layer over the composite layer; and
    an active layer over the optical waveguide layer.

15. The nitride semiconductor laser of claim 14, in which:
    the second sub-layer has a thickness; and
    at least one of the thickness of the second sub-layer and the second AlN molar fraction has a value at which the laser generates light having a far-field pattern that exhibits a single peak.

16. A nitride semiconductor laser, comprising:
    a portion of a nitride semiconductor layer structure according to claim 2;
    an optical waveguide layer over the composite layer; and
    an active layer over the optical waveguide layer.

17. The nitride semiconductor laser of claim 16, in which:

the second sub-layer has a thickness; and at least one of the thickness of the second sub-layer and the second AlN molar fraction has a value at which the laser generates light having a far-field pattern that exhibits a single peak.

18. A nitride semiconductor laser, comprising:

a portion of a nitride semiconductor layer structure according to claim 5;

an optical waveguide layer over the composite layer; and an active layer over the optical waveguide layer.

19. The nitride semiconductor laser of claim 18, in which:

the second sub-layer has a thickness; and at least one of the thickness of the second sub-layer and the second AlN molar fraction has a value at which the laser generates light having a far-field pattern that exhibits a single peak.

* * * * *